(12) United States Patent
Yeo et al.

(10) Patent No.: US 11,056,827 B2
(45) Date of Patent: Jul. 6, 2021

(54) ELECTRONIC DEVICE AND METHOD FOR IDENTIFYING STATE OF CONNECTION BETWEEN CONNECTOR AND ELECTRICAL PATH

(71) Applicant: Samsung Electronics Co., Ltd., Gyeonggi-do (KR)

(72) Inventors: Seunghyun Yeo, Gyeonggi-do (KR); Minyoung Kwon, Gyeonggi-do (KR); Jungmin Lee, Gyeonggi-do (KR); Hyunsu Lee, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/713,444

(22) Filed: Dec. 13, 2019

(65) Prior Publication Data

US 2020/0194928 A1    Jun. 18, 2020

(30) Foreign Application Priority Data

Dec. 14, 2018    (KR) .......................... 10-2018-0161685

(51) Int. Cl.
| | |
|---|---|
| *H01R 13/62* | (2006.01) |
| *H01R 12/78* | (2011.01) |
| *H01Q 1/24* | (2006.01) |
| *H03H 7/38* | (2006.01) |

(52) U.S. Cl.
CPC ............. *H01R 13/62* (2013.01); *H01Q 1/245* (2013.01); *H01R 12/78* (2013.01); *H03H 7/38* (2013.01)

(58) Field of Classification Search
CPC ........ H01R 13/62; H01R 12/78; H01Q 1/245; H03H 7/38
USPC .......................................................... 439/488
See application file for complete search history.

(56) References Cited

U.S. PATENT DOCUMENTS

| | | | |
|---|---|---|---|
| 6,989,664 B2 | 1/2006 | Shim et al. | |
| 9,900,999 B1* | 2/2018 | Lim ........................ | H04R 1/025 |
| 10,001,808 B1* | 6/2018 | Quinn ................... | G06F 1/1635 |
| 10,331,607 B2 | 6/2019 | Baek et al. | |
| 2010/0321129 A1 | 12/2010 | Onody et al. | |

(Continued)

FOREIGN PATENT DOCUMENTS

| | | |
|---|---|---|
| KR | 10-0198257 B1 | 6/1999 |
| KR | 10-0465235 B1 | 1/2005 |

(Continued)

OTHER PUBLICATIONS

International Search Report dated Apr. 8, 2020.

*Primary Examiner* — Peter G Leigh
(74) *Attorney, Agent, or Firm* — Cha & Reiter, LLC

(57) ABSTRACT

An electronic device is disclosed. The device includes a housing, a first printed circuit board (PCB) disposed in the housing and to including a first connector and a grip sensor, a second PCB disposed separate from the first PCB and including a second connector, an electrical path electrically coupled to the first connector and the second connector, at least one antenna forming part of the housing or disposed within the housing, a processor operatively connected to the grip sensor and the at least one antenna, a first conductive path electrically coupled to the grip sensor and the at least one antenna, and a second conductive path electrically coupled to the grip sensor and the first connector.

19 Claims, 12 Drawing Sheets

(56) References Cited

U.S. PATENT DOCUMENTS

| | | | |
|---|---|---|---|
| 2017/0164300 A1* | 6/2017 | Lee | H04B 1/3838 |
| 2017/0331175 A1* | 11/2017 | Kwon | H01Q 1/245 |
| 2018/0228038 A1* | 8/2018 | Lim | H01R 13/50 |
| 2018/0228039 A1* | 8/2018 | Lim | H05K 7/1427 |
| 2018/0234595 A1* | 8/2018 | Lim | H04N 5/2251 |
| 2018/0277934 A1* | 9/2018 | Kim | H01Q 9/42 |

FOREIGN PATENT DOCUMENTS

| | | |
|---|---|---|
| KR | 10-2012-0127078 A | 11/2012 |
| KR | 10-2018-0044602 A | 5/2018 |

* cited by examiner

ELECTRONIC DEVICE AND METHOD FOR IDENTIFYING STATE OF CONNECTION BETWEEN CONNECTOR AND ELECTRICAL PATH

CROSS-REFERENCE TO RELATED APPLICATION(S)

This application is based on and claims priority under 35 U.S.C. 119 to Korean Patent Application No. 10-2018-0161685, filed on Dec. 14, 2018, in the Korean Intellectual Property Office, the disclosure of which is herein incorporated by reference in its entirety.

BACKGROUND

Field

Certain embodiments relate to an electronic device for identifying the state of a connection between a connector and an electrical path and an operating method thereof.

Description of Related Art

Electronic devices may include at least one circuit including an electrical path and connectors respectively connected to both terminals of the electrical path according to requirements in design or requirements in performance.

The above information is presented as background information only to assist with an understanding of the disclosure. No determination has been made, and no assertion is made, as to whether any of the above might be applicable as prior art with regard to the disclosure.

SUMMARY

An electronic device may include an electrical path (e.g., a coaxial cable) and connectors respectively connected to both terminals of the electrical path according to requirements in design or requirements in performance. When an independent circuit for identifying a connection between each of the connectors and the electrical path is included in the electronic device, a lack of mounting spaces or processor ports may arise.

The technical subjects pursued in the disclosure may not be limited to the above mentioned technical subjects, and other technical subjects which are not mentioned may be clearly understood, through the following descriptions, by those skilled in the art of the disclosure.

An electronic device according to certain embodiments may include: a housing, a first printed circuit board (PCB) disposed in the housing and to including a first connector and a grip sensor, a second PCB disposed separate from the first PCB and including a second connector, an electrical path electrically coupled to the first connector and the second connector, at least one antenna forming part of the housing or disposed within the housing, a processor operatively connected to the grip sensor and the at least one antenna, a first conductive path electrically coupled to the grip sensor and the at least one antenna, and a second conductive path electrically coupled to the grip sensor and the first connector.

An electronic device according to certain embodiments may include: a sensor circuit configured to measure a capacitance value, a memory configured to store instructions, an antenna, radio-frequency integrated circuitry (RFIC), a first connector electrically coupled with the antenna, a second connector electrically coupled with the RFIC, a first path electrically coupling a first node between the antenna and the first connector with the sensor circuit, a second path electrically coupling a second node between the antenna and the first connector with the sensor circuit and distinguished from the first path, a third path electrically coupling the first connector and the second connector, and a processor operatively connected to the sensor circuit, wherein the instructions are executable by the processor to cause the electronic device to, wherein the sensor circuit is configured to: measure a first capacitance value at the first node using the first path, measure a second capacitance value at the second node using the second path, and transmit information about the first capacitance value and information about the second capacitance value to the processor, and wherein the instructions are executable by the processor to cause the electronic device to: receive the information associated with the first capacitance value and the second capacitance value, control a strength of a signal output through the antenna based on information about the first capacitance value, and identify a state of an electrical connection between the first connector and the third path, and a state of an electrical connection between the second connector and the third path, information about the second capacitance value.

An electronic device according to certain embodiments may include: a sensor circuit configured to obtain information including a capacitance value, a first circuit electrically coupled to the sensor circuit through a first path, and configured to operate differently depending on whether contact between the electronic device and an external object is detected, a first connector electrically coupled to the sensor circuit through a second path different from the first path, a second connector, a coaxial cable electrically coupled to the first connector and the second connector, a display, a memory configured to store instructions, and a processor, wherein the instructions are executable by the processor to cause the electronic device to: obtain information about a first capacitance value measured through the first path from the first circuit as detected by the sensor circuit, obtain information about a second capacitance value measured through the second path from the first connector as detected by the sensor circuit, and display the information about the first capacitance value and the information about the second capacitance value on the display.

An electronic device and a method thereof according to certain embodiments may identify the state of a connection between a connector and an electrical path using a sensor circuit configured to measure a capacitance value, thereby enhancing the efficiency of resources used in the electronic device.

Effects which can be acquired by the disclosure are not limited to the above described effects, and other effects that have not been mentioned may be clearly understood by those skilled in the art from the following description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
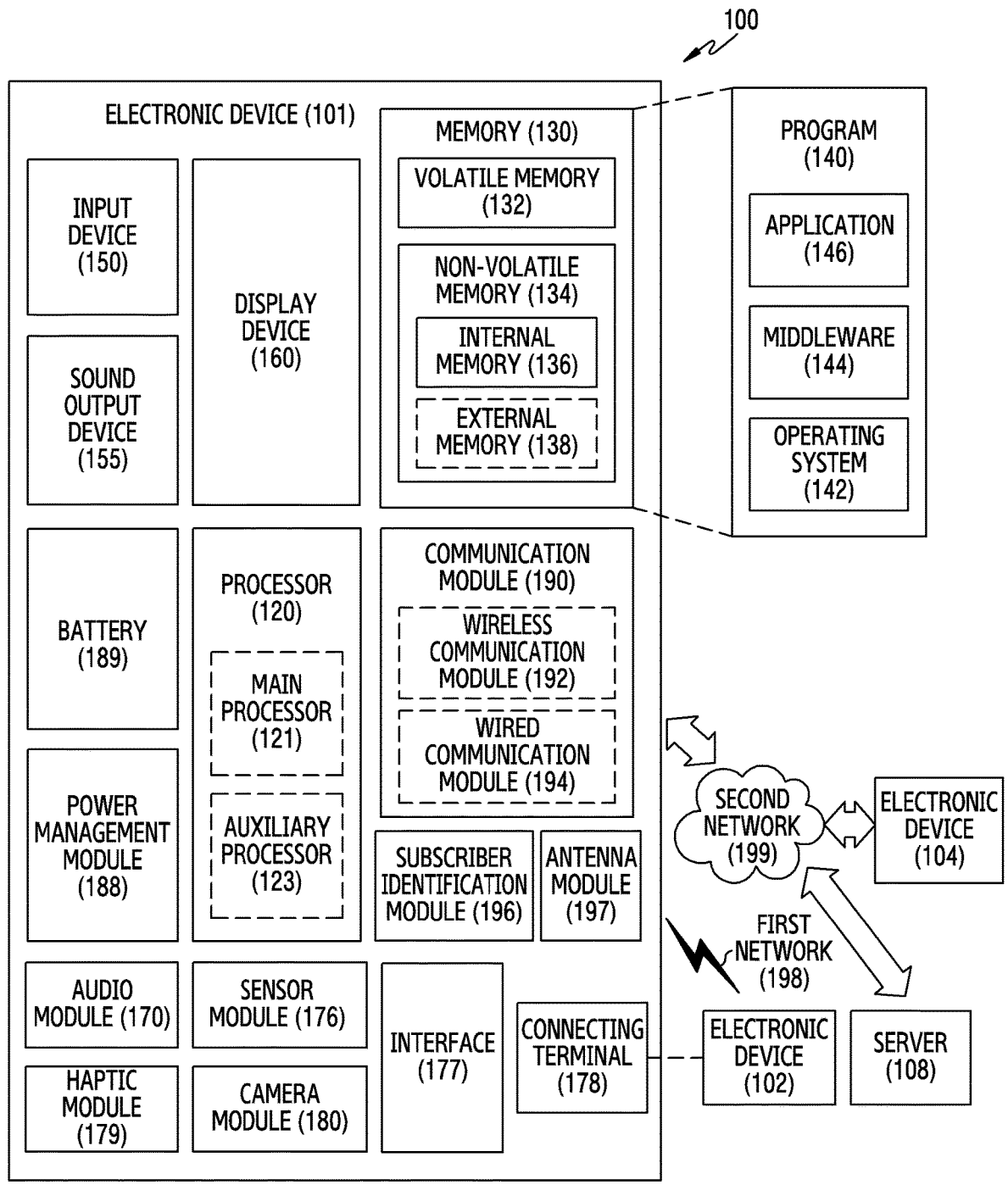
FIG. 1 is a block diagram illustrating an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module(SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element implemented by a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
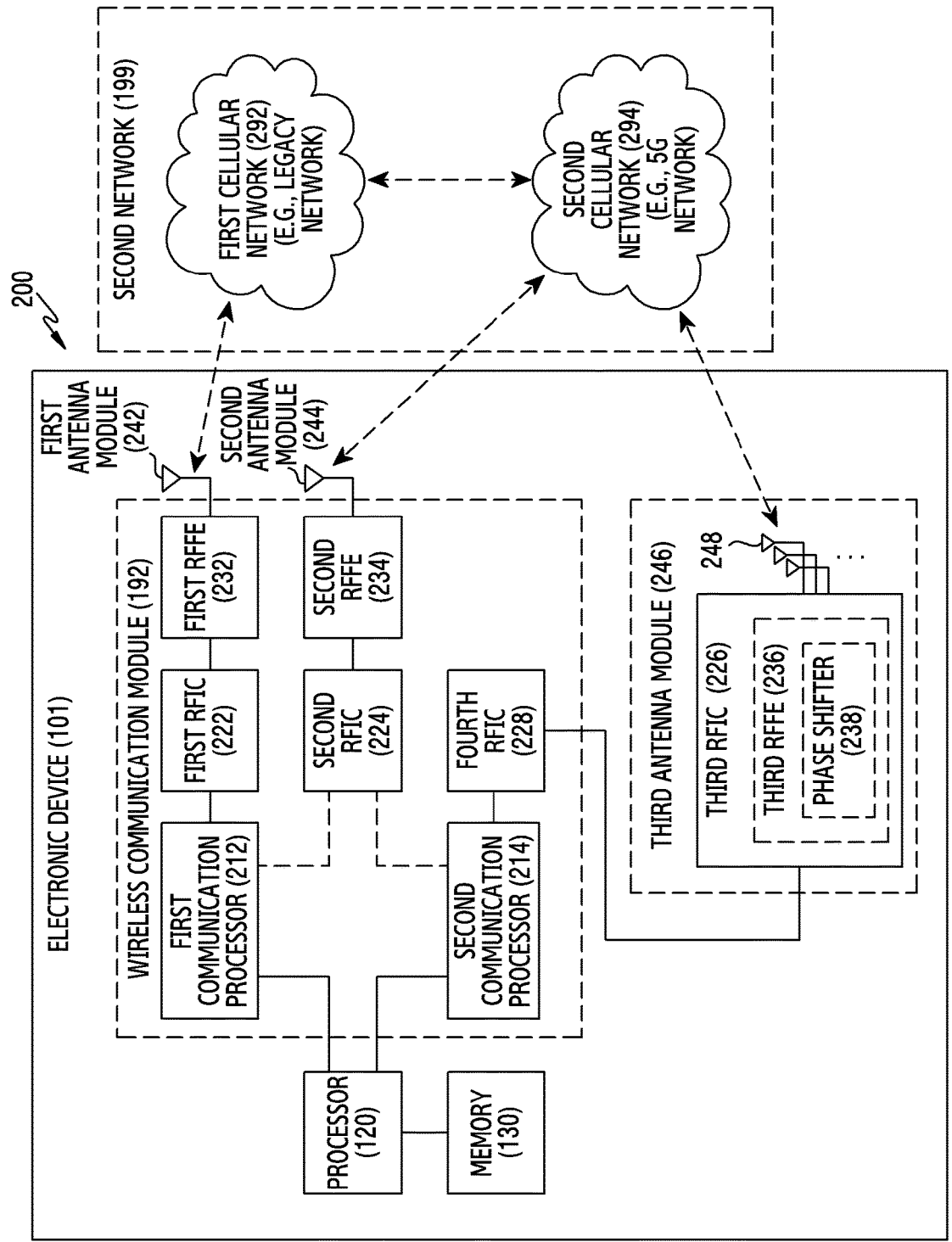
FIG. 2 is a block diagram illustrating an electronic device for supporting legacy network communication and 5G network communication according to certain embodiments.

FIG. 2 is a block diagram 200 illustrating an electronic device 101 for supporting legacy network communication and 5G network communication according to certain embodiments. Referring to FIG. 2, the electronic device 101 may include a first communication processor 212, a second communication processor 214, a first radio-frequency integrated circuit (RFIC) 222, a second RFIC 224, a third RFIC 226, a fourth RFIC 228, a first radio-frequency front end (RFFE) 232, a second RFFE 234, a first antenna module 242, a second antenna module 244, and an antenna 248. The electronic device 101 may further include a processor 120 and a memory 130. The network 199 may include a first network 292 and a second network 294. According to another embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least part of a wireless communication module 192. According to another embodiment, the fourth RFIC 228 may be omitted or may be included as part of the third RFIC 226.

The first communication processor 212 may establish a communication channel in a band to be used for wireless communication with the first network 292 and may support legacy network communication through the established communication channel. According to certain embodiments, the first network may be a legacy network including a second-generation (2G), 3G, 4G, or Long-Term Evolution (LTE) network. The second communication processor 214 may establish a communication channel corresponding to a designated band (e.g., about 6 GHz to about 60 GHz) in a band to be used for wireless communication with the second network 294 and may support 5G network communication through the established communication channel. According to certain embodiments, the second network 294 may be a 5G network defined by the 3GPP. Additionally, according to an embodiment, the first communication processor 212 or the second communication processor 214 may establish a communication channel corresponding to another designated band (e.g., about 6 GHz or less) in the band to be used for wireless communication with the second network 294 and may support 5G network communication through the established communication channel. According to an embodiment, the first communication processor 212 and the second communication processor 214 may be configured in a single chip or a single package. According to certain embodiments, the first communication processor 212 or the second communication processor 214 may be formed, along with the processor 120, a coprocessor 123, or a communication module 190, in a single chip or a single package. According to an embodiment, the first communication processor 212 and the second communication processor 214 may be connected to each other directly or indirectly via an interface (not shown) and may provide or receive data or a control signal in one direction or in two directions.

In transmission, the first RFIC 222 may convert a baseband signal, generated by the first communication processor 212, into an RF signal of about 700 MHz to about 3 GHz used for the first network 292 (e.g., the legacy network). In reception, an RF signal may be obtained from the first network 292 (e.g., the legacy network) through an antenna (e.g., the first antenna module 242) and may preprocessed by an RFFE (e.g., the first RFFE 232). The first RFIC 222 may convert the preprocessed RF signal into a baseband signal to be processed by the first communication processor 212.

In transmission, the second RFIC 224 may convert a baseband signal, generated by the first communication processor 212 or the second communication processor 214, into an RF signal (hereinafter, "5G Sub6 RF signal") of a Sub6 band (e.g., about 6 GHz or less) used for the second network 294 (e.g., the 5G network). In reception, a 5G Sub6 RF signal may be obtained from the second network 294 (e.g., the 5G network) through an antenna (e.g., the second antenna module 244) and may preprocessed by an RFFE (e.g., the second RFFE 234). The second RFIC 224 may convert the preprocessed 5G Sub6 RF signal into a baseband signal to be processed by a corresponding communication processor of the first communication processor 212 or the second communication processor 214.

The third RFIC 226 may convert a baseband signal, generated by the second communication processor 214, into an RF signal (hereinafter, "5G Above6 RF signal") of a 5G Above6 band (e.g., about 6 GHz to about 60 GHz) used for the second network 294 (e.g., the 5G network). In reception, a 5G Above6 RF signal may be obtained from the second network 294 (e.g., the 5G network) through an antenna (e.g., the antenna 248) and may preprocessed by a third RFFE 236. The third RFIC 226 may convert the preprocessed 5G Above6 RF signal into a baseband signal to be processed by the second communication processor 214. According to an embodiment, the third RFFE 236 may be formed as part of the third RFIC 226.

According to an embodiment, the electronic device 101 may include the fourth RFIC 228 separately from the third RFIC 226 or as at least part thereof. In this case, the fourth RFIC 228 may convert a baseband signal, generated by the second communication processor 214, into an RF signal (hereinafter, "IF signal") of an intermediate frequency band (e.g., about 9 GHz to about 11 GHz) and may transmit the IF signal to the third RFIC 226. The third RFIC 226 may convert the IF signal into a 5G Above6 RF signal. In reception, a 5G Above6 RF signal may be received from the second network 294 (e.g., the 5G network) through an antenna (e.g., the antenna 248) and may be converted into an RF signal by the third RFIC 226. The fourth RFIC 228 may convert the IF signal into a baseband signal to be processed by the second communication processor 214.

According to an embodiment, the first RFIC 222 and the second RFIC 224 may be configured as at least part of a single chip or a single package. According to an embodiment, the first RFFE 232 and the second RFFE 234 may be configured as at least part of a single chip or a single package. According to an embodiment, at least one of the first antenna module 242 or the second antenna module 244 may be omitted or may be combined with another antenna module to process RF signals of a plurality of corresponding bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed on a portion (e.g., a lower surface) of a second substrate (e.g., a sub-PCB) separate from the first substrate, and the antenna 248 may be disposed on another portion (e.g., an upper surface) thereof, thereby forming the third antenna module 246. Disposing the third RFIC 226 and the antenna 248 on the same substrate makes it possible to reduce the length of a transmission line therebetween. Accordingly, for example, it is possible to reduce the loss (e.g., attenuation) of a signal in a high-frequency band (e.g., about 6 GHz to about 60 GHz) used for 5G network communication due to the transmission line. Therefore, the electronic device 101 can improve the quality or speed of communication with the second network 294 (e.g., the 5G network).

According to an embodiment, the antenna 248 may be formed as an antenna array including a plurality of antenna elements used for beamforming. In this case, the third RFIC 226 may include a plurality of phase shifters 238 corresponding to the plurality of antenna elements, for example, as part of the third RFFE 236. In transmission, each of the plurality of phase shifters 238 may convert the phase of a 5G Above6 RF signal to be transmitted to an outside (e.g., a base station in the 5G network) of the electronic device 101 through a corresponding antenna element. In reception, each of the plurality of phase shifters 238 may convert the phase of a 5G Above6 RF signal, received from the outside through a corresponding antenna element, into the same or substantially the same phase. Accordingly, it is possible to enable transmission or reception through beamforming between the electronic device 101 and the outside.

The second network 294 (e.g., the 5G network) may operate independently of the first network 292 (e.g., the legacy network) (e.g., in a standalone (SA) manner) or may operate in connection therewith (e.g., in a non-standalone (NSA) manner). For example, the 5G network may have only an access network (e.g., a 5G radio access network (RAN) or a next-generation RAN (NG RAN)) without having a core network (e.g., a next-generation core (NGC)). In this case, the electronic device 101 may access the access network of the 5G network and may then access an external network (e.g., the Internet) under control of a core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 130 and may be accessed by a different component (e.g., the processor 120, the first communication processor 212, or the second communication processor 214).

An electronic device according to certain embodiments disclosed herein may be various types of devices. The electronic devices may include, for example, a portable communication device (e.g., a smart phone), a computer device, a portable multimedia device, a portable medical device, a camera, a wearable device, or a home appliance. According to an embodiment, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with,", it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the invoked at least one instruction. The one or more instructions may include a code generated by a complier or a code executable by an interpreter. The machine-readable storage media may be provided in the form of non-transitory storage media. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more components of the above-described components or operations may be omitted, or one or more other components or operations may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 3:
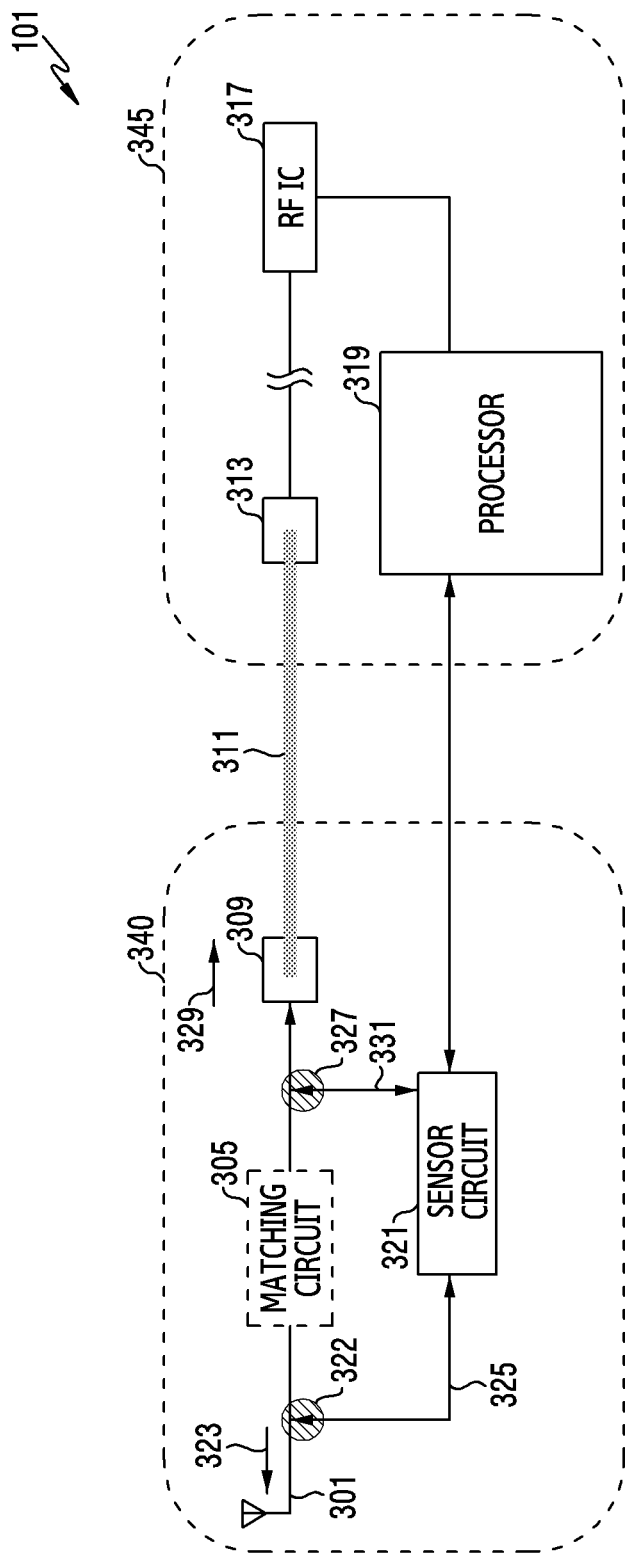
FIG. 3 illustrates an example of a functional component of an electronic device according to certain embodiments.

FIG. 3 illustrates an example of a functional component of an electronic device according to certain embodiments. The function component may be included in the electronic device 101 illustrated in FIG. 1 or FIG. 2.

Figure 4:
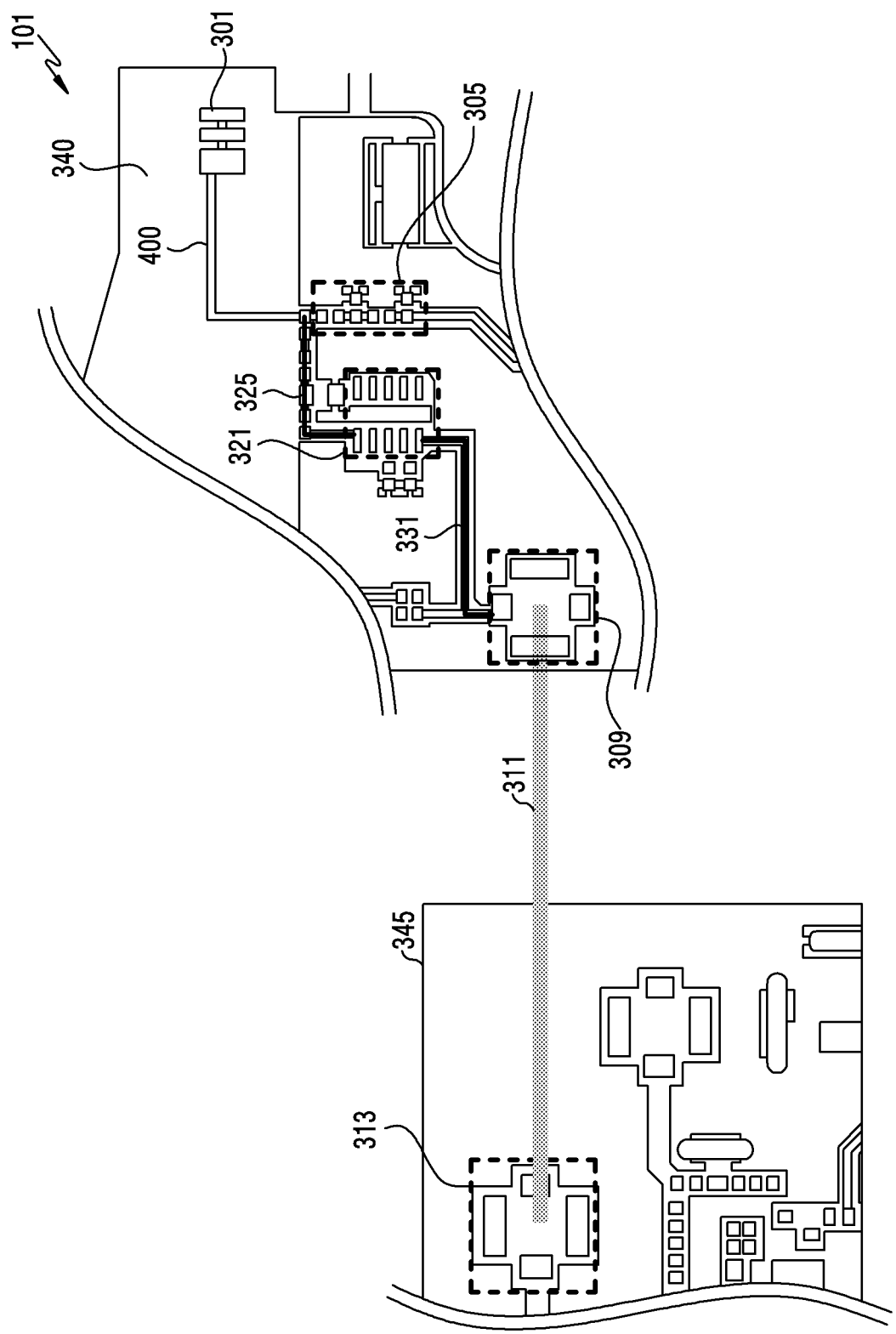
FIG. 4 illustrates an example of a printed circuit board (PCB) of an electronic device according to certain embodiments.

FIG. 4 illustrates an example of a printed circuit board (PCB) of an electronic device according to certain embodiments.

Referring to FIG. 3, the electronic device 101 may include an antenna 301, a matching circuit 305, a first connector 309, an electrical path 311, a second connector 313, radio-frequency integrated circuitry (RFIC) 317, a processor 319, and a sensor circuit 321.

In certain embodiments, the antenna 301 may include at least one a first antenna module 242, a second antenna module 244, or a third antenna module 246; the RFIC 317 may include at least one of a first RFIC 222, a second RFIC 224, a third RFIC 226, or a fourth RFIC 228; and the processor 319 may include a processor 120. In certain embodiments, the RFIC 317 may include at least one of a first RFFE 232 or a second RFFE 234.

In certain embodiments, the antenna 301 may form part of a housing which forms the external appearance of the electronic device 101, or alternatively, may be disposed in the housing. In certain embodiments, the antenna 301 may be used to transmit a signal to an external electronic device (e.g., the electronic device 102), or receive a signal the external electronic device. In certain embodiments, the signal transmitted to the external electronic device through the antenna 301 may be a signal generated by the processor 319 and processed by the RFIC 317. In certain embodiments, the signal processed by the RFIC 317 may be provided to the antenna 301 via the matching circuit 305 through the electrical path 311 and may be output to the outside through the antenna 301. In certain embodiments, the signal received from the external electronic device through the antenna 301 may be processed by the RFIC 317 and may be interpreted by the processor 319.

In certain embodiments, the matching circuit 305 may be used to match the impedance between the RFIC 317 and the antenna 301. In certain embodiments, the matching circuit 305 may include at least one of a resistor, a capacitor, or an inductor, to match the impedance between the RFIC 317 and the antenna 301. In certain embodiments, the matching circuit 305 may be electrically connected (e.g., electrically coupled) with a ground member in order to match the impedance between the RFIC 317 and the antenna 301. In certain embodiments, a first terminal of the matching circuit 305 may be electrically connected to the antenna 301. In some embodiments, the matching circuit 305 may not be included in the electronic device 101.

In certain embodiments, the first connector 309 may be electrically connected to the antenna 301 or may be electrically connected to the matching circuit 305. For example, when the electronic device 101 includes the matching circuit 305, the first connector 309 may be electrically connected to a second terminal of the matching circuit 305. When the electronic device 101 does not include the matching circuit 305, the first connector 309 may be electrically connected to the antenna 301. In certain embodiments, the first connector 309 may be used to electrically connect a first terminal of both terminals of the electrical path 311 with the antenna 301 or the matching circuit 305. In certain embodiments, the first connector 309 may be physically connected with the first terminal of the electrical path 311.

In certain embodiments, the electrical path 311 may be used to provide a signal processed by the RFIC 317 to the antenna 301. In certain embodiments, the electrical path 311 may be used to provide, to the RFIC 317, a signal provided from the antenna 301 or a signal provided from the antenna 301 through the matching circuit 305. In certain embodiments, the first terminal of both terminals of the electrical path 311 may be connected to the first connector 309. In certain embodiments, a second terminal of both terminals of the electrical path 311 may be connected to the second connector 313.

In certain embodiments, the second connector 313 may be used to electrically connect the second terminal of the electrical path 311 with the RFIC 317. For example, the second connector 313 may be directly connected to the RFIC 317 in order to electrically connect the second terminal of the electrical path 311 with the RFIC 317. In another example, the second connector 313 may be connected to an RFIC 317 through at least one electrical element in order to electrically connect the second terminal of the electrical path 311 with the RFIC 317. In certain embodiments, the at least one electrical element may be electrically connected to the first connector 309 rather than the second connector 313. In certain embodiments, an example of the at least one electrical element will be described below with reference to FIG. 5A and FIG. 5B. In certain embodiments, the second connector 313 may be physically connected with the second terminal of the electrical path 311.

In certain embodiments, the RFIC 317 may be electrically connected to the second connector 313 or may be connected to the second connector 313 through the at least one electrical element. In certain embodiments, the RFIC 317 may be electrically connected to the processor 319.

In certain embodiments, the RFIC 317 may receive a signal generated by the processor 319 from the processor 319. In certain embodiments, the RFIC 317 may process the signal received from the processor 319. For example, the RFIC 317 may convert a signal in a first band received from the processor 319 into a signal in a second band higher than the first band. In another example, the RFIC 317 may modulate the signal received from the processor 319 according to a designated modulation scheme, but is not limited thereto. In certain embodiments, the RFIC 317 may provide the processed signal to the antenna 301 via the electrical path 311 in order to transmit the processed signal.

In certain embodiments, the processor 319 may be electrically connected to the RFIC 317. In certain embodiments, the processor 319 may be electrically connected to the sensor circuit 321. In certain embodiments, the processor 319 may generate or configure information to be included in a signal to be transmitted to the external electronic device through the antenna 301. In certain embodiments, the processor 319 may identify or obtain information included in a signal received from the external electronic device through the antenna 301.

In certain embodiments, the sensor circuit 321 may be configured to measure a capacitance value. For example, the sensor circuit 321 may include a grip sensor or a touch sensor configured to measure a capacitance value or to measure a change in capacitance value.

In certain embodiments, the sensor circuit 321 may measure a first capacitance value seen in a first direction 323 from a first node 322 connected to the antenna 301 in order to detect whether the housing of the electronic device 101 is in contact with an external object. In certain embodiments, the sensor circuit 321 may measure the first capacitance value in order to detect whether a user's body part is in contact with the housing. In certain embodiments, the sensor circuit 321 may be connected with the antenna 301 through a first path 325 in order to measure the first capacitance value seen from the first node 322 in the first direction 323. In certain embodiments, the sensor circuit 321 may provide information about the first capacitance value to the processor 319. In certain embodiments, the sensor circuit 321 may provide the information about the first capacitance value to the processor 319 in order to change the strength of a signal output from the antenna 301 according to whether the user's body part is in contact with the housing.

In certain embodiments, the sensor circuit 321 may measure a second capacitance value seen in a second direction 329 from a second node 327 connected to the first connector 309 in order to identify the state of a connection between the first connector 309 and the electrical path 311 and the state of a connection between the second connector 313 and the electrical path 311. In certain embodiments, the sensor circuit 321 may be connected to the first connector 309 through a second path 331 in order to measure the second capacitance value seen in the second direction 329 from the second node 327. In certain embodiments, the sensor circuit 321 may provide information about the second capacitance value to the processor 319. In certain embodiments, the sensor circuit 321 may provide the information about the second capacitance value to the processor 319 in order to identify the state of the connection between the first connector 309 and the electrical path 311 and the state of the connection between the second connector 313 and the electrical path 311.

In certain embodiments, the processor 319 may receive the information about the first capacitance value from the sensor circuit 321. In certain embodiments, the information about the first capacitance value may include data indicating the first capacitance value. In certain embodiments, the information about the first capacitance value may include data indicating the degree of change in first capacitance. For example, the data indicating the degree of change in first capacitance may be the difference between a previous first capacitance value and a current first capacitance value. In another example, the data indicating the degree of change in first capacitance may be the difference between the first capacitance value and a reference value. However, the data is not limited thereto.

In certain embodiments, the processor 319 may receive the information about the second capacitance value from the sensor circuit 321. In certain embodiments, the information about the second capacitance value may include data indicating the second capacitance value. In certain embodiments, the information about the second capacitance value may include data indicating the degree of change in second capacitance. For example, the data indicating the degree of change in second capacitance may be a difference between a previous second capacitance value and a current second capacitance value. In another example, the data indicating the degree of change in second capacitance may be a difference between the second capacitance value and a reference value. However, the data is not limited thereto.

In certain embodiments, the processor 319 may control the strength of a signal output through the antenna 301 or the power of the signal on the basis of the information about the first capacitance value. For example, the processor 319 may determine whether the first capacitance value is within a reference range in order to identify whether the electronic device 101 or the housing of the electronic device 101 is in contact with the user's body part. For example, when it is determined that the first capacitance value is within the reference range, the processor 319 may adjust the strength of the signal to be lower than a reference strength. For example, when it is determined that the first capacitance value is within the reference range, the processor 319 may control the strength of the signal so that the signal has a specific absorption rate (SAR) lower than a reference SAR. For example, the electronic device 101 may radiate a signal using the antenna 301 in order to communicate with the external electronic device. The electronic device 101 radiating the signal may measure a SAR, which is the rate at which the signal radiated from the electronic device 101 is absorbed into biological tissues. A plurality of authorized organizations manages a standard for the degree of hazard to the human body using the measured SAR. In order to meet this standard, manufacturers may control the strength of a signal radiated from an electronic device. In certain embodiments, when it is determined that the first capacitance value is within the reference range, the processor 319 may control the power of the signal to a human-hazardless level.

In another example, when it is determined that the first capacitance value is out of the reference range, the processor 319 may maintain the strength of the signal. For example, when it is determined that the first capacitance value is out of the reference range, the processor 319 may control the strength (or SAR) of the signal separately from the reference strength or the reference SAR.

In certain embodiments, the processor 319 may identify the state of the connection between the first connector 309 and the electrical path 311 and the state of the connection between the second connector 313 and the electrical path 311 on the basis of the information about the second capacitance value to the processor 319. For example, the processor 319 may determine whether the second capacitance value is within a first reference range in order to determine whether the state of the connection between the first connector 309 and the electrical path 311 is a normal state and to determine whether the state of the connection between the second connector 313 and the electrical path 311 is the normal state. In one example, when it is identified that the second capacitance value is within the first reference range, the processor 319 may determine that the state of the connection between the first connector 309 and the electrical path 311 is the normal state and may determine that the state of the connection between the second connector 313 and the electrical path 311 is the normal state. In another example, when it is identified that the second capacitance value is out of the first reference range and is within a second reference range, the processor 319 may determine that the state of the connection between the first connector 309 and the electrical path 311 is the normal state and may determine that the state of the connection between the second connector 313 and the electrical path 311 is an abnormal state. In still another example, when it is identified that the second capacitance value is out of the first reference range and is out of the second reference range, the processor 319 may determine that the state of the connection between the first connector 309 and the electrical path 311 is the abnormal state.

In certain embodiments, the processor 319 may display the information about at least one of the first capacitance value or the second capacitance value on a display device 160 (not shown in FIG. 3) of the electronic device 101. In certain embodiments, the processor 319 may display information indicating that at least one of the state of the connection between the first connector 309 and the electrical path 311 or the state of the connection between the second connector 313 and the electrical path 311 is the abnormal state on the display device 160 but is not limited thereto.

In certain embodiments, the antenna 301, the matching circuit 305, the first connector 309, and the sensor circuit 321 may be disposed in a first printed circuit board (PCB) 340, and the second connector 313 and the RFIC 317 may be disposed in a second PCB 345. In this case, the processor 319 may be disposed in the first PCB 340 or may be disposed in the second PCB 345. For example, referring to FIG. 4, the first PCB 340 may include the antenna 301, the matching circuit 305, and the first connector 309, and the second PCB 345 may include the second connector 313. In the first PCB 340, the antenna 301 may be connected to the matching circuit 305 via a path 400, and the matching circuit 305 may be connected to the sensor circuit 321 through the first path 325 formed on (or in) the first PCB 340. In the first PCB 340, the first connector 309 may be connected to the sensor circuit 321 through the second path 331 formed on (or in) the first PCB 340. According to embodiments, a path between the matching circuit 305 and the first connector 309 may also be formed on (or in) the first PCB 340. In certain embodiments, the electrical path 311 may connect the first connector 309 disposed on (or in) the first PCB 340 with the second connector 313 disposed on (or in) the second PCB 345.

In certain embodiments, unlike in FIG. 3 and FIG. 4, the antenna 301, the matching circuit 305, the first connector 309, the second connector 313, the RFIC 317, the processor 319 and the sensor circuit 321 may be disposed in a single PCB.

FIG. 3 and FIG. 4 illustrate an example in which the electrical path 311 is configured for a signal output from the antenna 301 or input through the antenna 301, which is for convenience of description. For example, the antenna 301 may be an example of a first circuit that is electrically connected to the sensor circuit 321 and operates differently depending on whether contact between an external object and the electronic device 101 is detected. In this case, the RFIC 317 may be an example of a second circuit that provides information to the first circuit or obtains information from the first circuit.

As described above, the electronic device 101 according to certain embodiments may identify the state of the connection between the first connector 309 and the electrical path 311 and the state of the connection between the second connector 313 and the electrical path 311 using the sensor circuit 321 disposed in the electronic device 101 and configured to measure a capacitance value. The electronic device 101 according to certain embodiments may use the sensor circuit 321 for the identification, thus not requiring a separate circuit for the identification. The electronic device 101 according to certain embodiments does not require a separate circuit for the identification, thus increasing the number of available ports for the processor 319 and securing a mounting space for the electronic device 101. That is, the electronic device 101 may enhance resource efficiency of the electronic device 101 using the sensor circuit 321 for the identification.

Figure 5A:
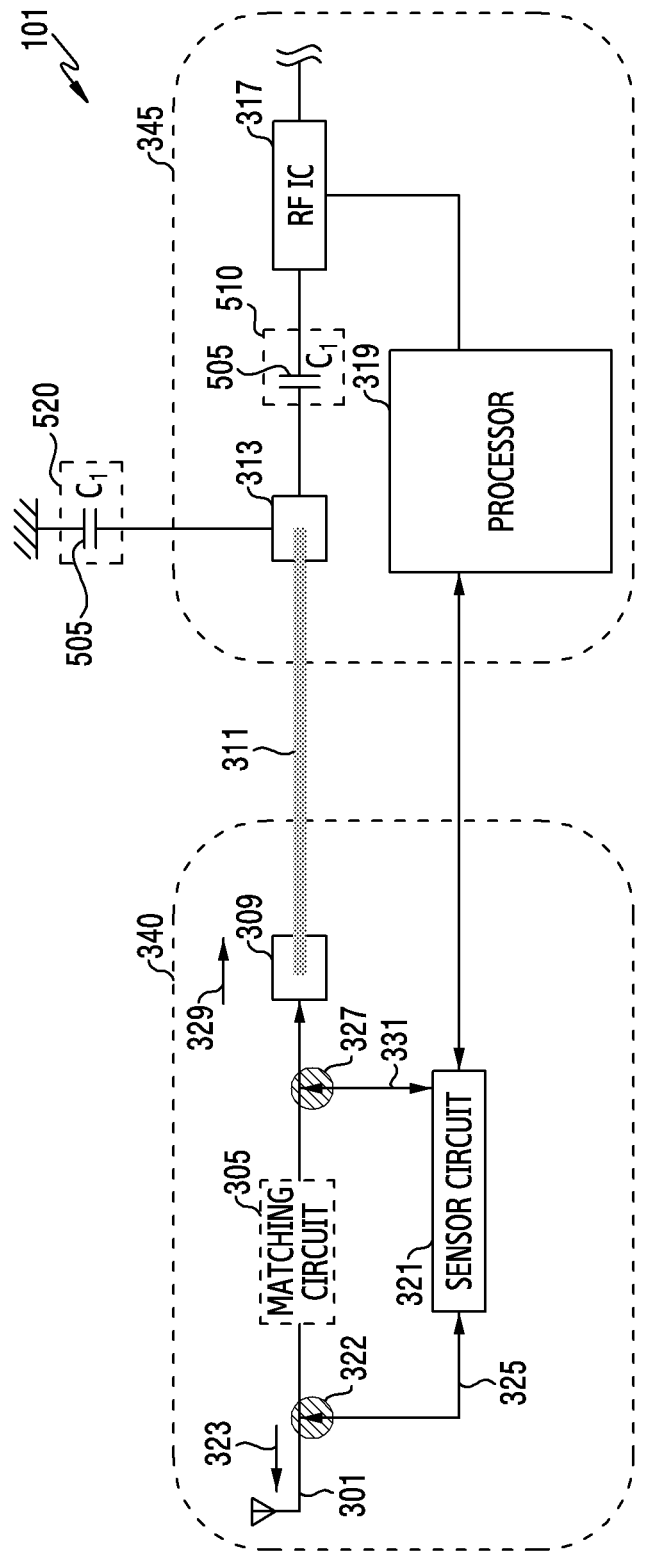
FIG. 5A illustrates examples of an electrical element included in an electronic device 101 to identify the state of a connection between each of connectors and an electrical path according to certain embodiments.
Figure 5B:
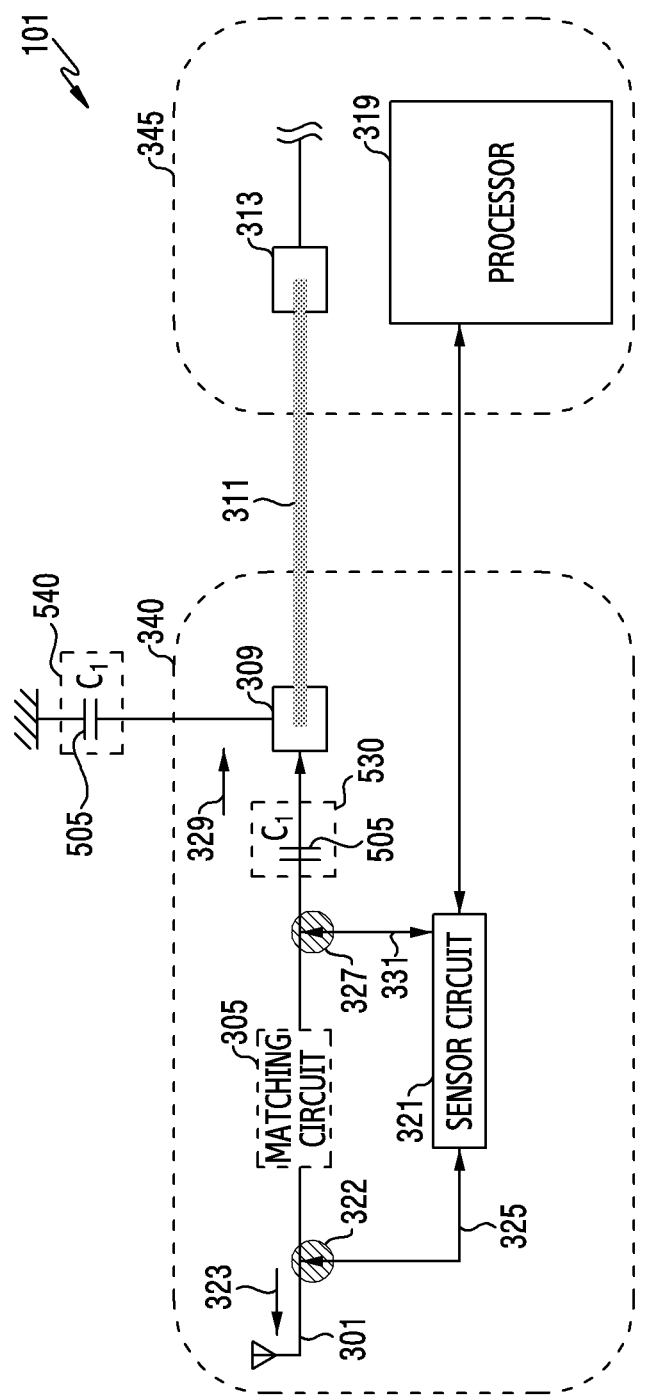
FIG. 5B illustrates examples of an electrical element included in an electronic device 101 to identify the state of a connection between each of connectors and an electrical path according to certain embodiments.

FIG. 5A illustrates examples of an electrical element included in an electronic device 101 to identify the state of a connection between each of connectors and an electrical path according to certain embodiments, and FIG. 5B illustrates examples of an electrical element included in an electronic device 101 to identify the state of a connection between each of connectors and an electrical path according to certain embodiments.

In certain embodiments, an antenna 301, a matching circuit 305, a first connector 309, an electrical path 311, a second connector 313, an RFIC 317, a processor 319, a sensor circuit 321, a first path 325, and a second path 331 may respectively correspond to the antenna 301, the matching circuit 305, the first connector 309, the electrical path 311, the second connector 331 the RFIC 317, the processor 319, the sensor circuit 321, the first path 325, and the second path 331 described with reference to FIG. 3.

Referring to FIGS. 5A and 5B, the electrical element 505 (e.g., a capacitor C1) may be included in the electronic device 101 in order to clearly identify a case the state of a connection between the first connector 309 and the electrical path 311 and the state of a connection between the second connector 313 and the electrical path 311 is normal and a case where the state of the connection between the first connector 309 and the electrical path 311 and/or the state of the connection between the second connector 313 and the electrical path 311 is abnormal. For example, it is assumed that a second capacitance value seen in a second direction 329 from a second node 327 in a case where the state of the connection between the first connector 309 and the electrical path 311 is abnormal is a first value, a second capacitance value seen in the second direction 329 from the second node 327 in a case where the state of the connection between the second connector 313 and the electrical path 311 is abnormal is a second value, and a second capacitance value seen in the second direction 329 from the second node 327 in a case where the state of the connection between the first connector 309 and the electrical path 311 and the state of the connection between the second connector 313 and the electrical path 311 are normal is a third value. In certain embodiments, the electrical elements 505 may be included in the electronic device 101 to increase the difference between the first value and the second value, to increase the difference between the first value and the third value, or to increase the difference between the second value and the third value, but is not limited thereto.

In certain embodiments, the electrical element 505 may be disposed at various positions by various methods.

In one example, referring to FIG. 5A, the electrical element 505 may be disposed between the second connector 313 and the RFIC 317 as in a state 510. In certain embodiments, the electrical element 505 may be connected to the second connector 313 in parallel with the RFIC 317 as in a state 520 instead of being disposed between the second connector 313 and the RFIC 317 as in the state 510. When the electrical element 505 is disposed as in the state 520, a first terminal of the electrical element 505 may be connected to the second connector 313, and a second terminal of the electrical element 505 may be connected to a ground terminal.

In another example, referring to FIG. 5B, the electrical element 505 may be disposed between the first connector 309 and the second node 327 as in a state 530. In certain embodiments, the electrical element 505 may be connected to the first connector 309 in parallel with the second node 327 as in a state 540 instead of being disposed between the first connector 309 and the second node 327. When the electrical element 505 is disposed as in the state 540, the first terminal of the electrical element 505 may be connected to the first connector 309, and the second terminal of the electrical element 505 is connected to the ground terminal.

FIG. 5A illustrates an example of connecting the electrical element 505 with the second connector 313, and FIG. 5B illustrates an example of connecting the electrical element 505 with the first connector 309. However, these examples are illustrated for convenience of description. For example, the electrical element 505 may include a plurality of electrical elements, and each of the plurality of electrical elements may be connected to each of the first connector 309 and the second connector 313.

Figure 6:
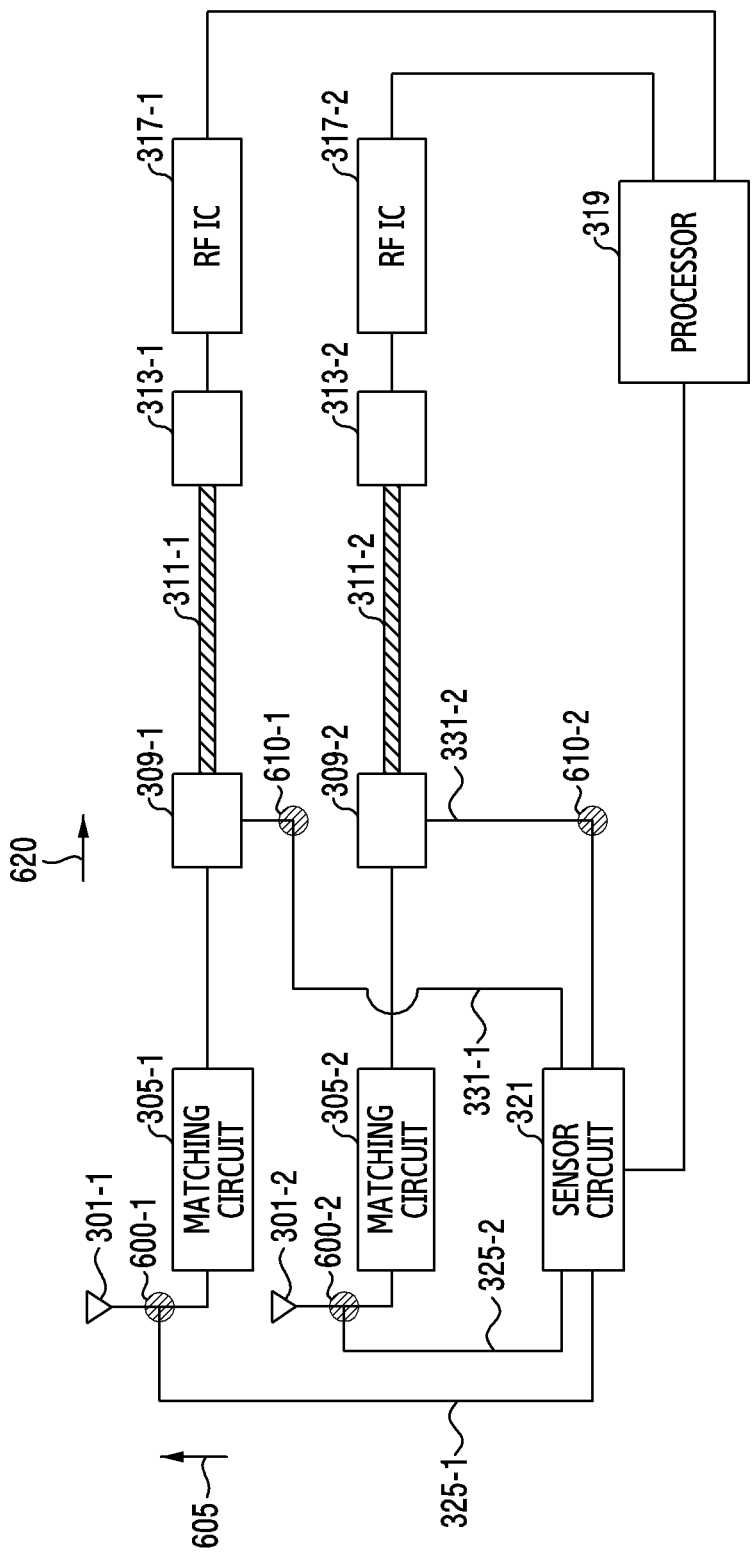
FIG. 6 illustrates another example of a functional component of an electronic device according to certain embodiments.

FIG. 6 illustrates another example of a functional component of an electronic device according to certain embodiments. The functional component may be included in the electronic device 101 illustrated in FIG. 1 or FIG. 2.

Each of an antenna 301-1 and an antenna 301-2 of FIG. 6 may correspond to the antenna 301 of FIG. 3; each of a matching circuit 305-1 and a matching circuit 305-2 of FIG. 6 may correspond to the matching circuit 305 of FIG. 3; each of a first connector 309-1 and a first connector 309-2 of FIG. 6 may correspond to the first connector 309 of FIG. 3; each of an electrical path 311-1 and an electrical path 311-2 of FIG. 6 may correspond to the electrical path 311 of FIG. 3; each of a second connector 313-1 and a second connector 313-2 of FIG. 6 may correspond to the second connector 313 of FIG. 3; each of an RFIC 317-1 and an RFIC 317-2 of FIG. 6 may correspond to the RFIC 317 of FIG. 3; a processor 319 of FIG. 6 may correspond to the processor 319 of FIG. 3; a sensor circuit 321 of FIG. 6 may correspond to the sensor circuit 321 of FIG. 3; and each of a path 325-1 and a path 325-2 of FIG. 6 may correspond to the first path 325 of FIG. 3; and each of a path 331-1 and a path 331-2 of FIG. 6 may correspond to the second path 331 of FIG. 3.

Referring to FIG. 6, in certain embodiments, the sensor circuit 321 may obtain a first capacitance value of the circuit seen from a node 600-1 in a first direction 605 and may obtain a second capacitance value of the circuit seen from a node 600-2 in the first direction 605. The sensor circuit 321 may transmit information about the first capacitance value and information about the second capacitance value to the processor 319.

In certain embodiments, the sensor circuit 321 may obtain a third capacitance value of the circuit seen from a node 610-1 in a second direction 620 and may obtain a fourth capacitance value of the circuit seen from a node 610-2 in the second direction 620. The sensor circuit 321 may transmit information about the third capacitance value and information about the fourth capacitance value to the processor 319.

In certain embodiments, the processor 319 may receive the information about the first capacitance value, may determine whether the antenna 301-1 or a housing positioned adjacent to the antenna 301-1 is in contact with a body part on the basis of the information about the first capacitance value, and may control the strength of a signal output from the antenna 301-1 according to the determination.

In certain embodiments, the processor 319 may receive the information about the second capacitance value, may determine whether the antenna 301-2 or a housing positioned adjacent to the antenna 301-2 is in contact with a body part on the basis of the information about the second capacitance value, and may control the strength of a signal output from the antenna 301-2 according to the determination.

In certain embodiments, the processor 319 may receive the information about the third capacitance value and may identify the state of a connection between the first connector 309-1 and the electrical path 311-1 and the state of a connection between the second connector 313-1 and the electrical path 311-1 on the basis of the information about the third capacitance value.

In certain embodiments, the processor 319 may receive the information about the fourth capacitance value and may identify the state of a connection between the first connector 309-2 and the electrical path 311-2 and the state of a connection between the second connector 313-2 and the electrical path 311-2 on the basis of the information about the fourth capacitance value.

As described above, the electronic device 101 according to certain embodiments may identify the state of a connection between each of a plurality of electrical paths and connectors connected to each of the plurality of electrical connectors using the sensor circuit 321 without using a separate circuit connected to the processor 319. The electronic device 101 according to certain embodiments may perform the identification using the sensor circuit 321, thus maintaining the number of ports of the processor 319 independently of the number of the plurality of electrical paths.

Figure 7:
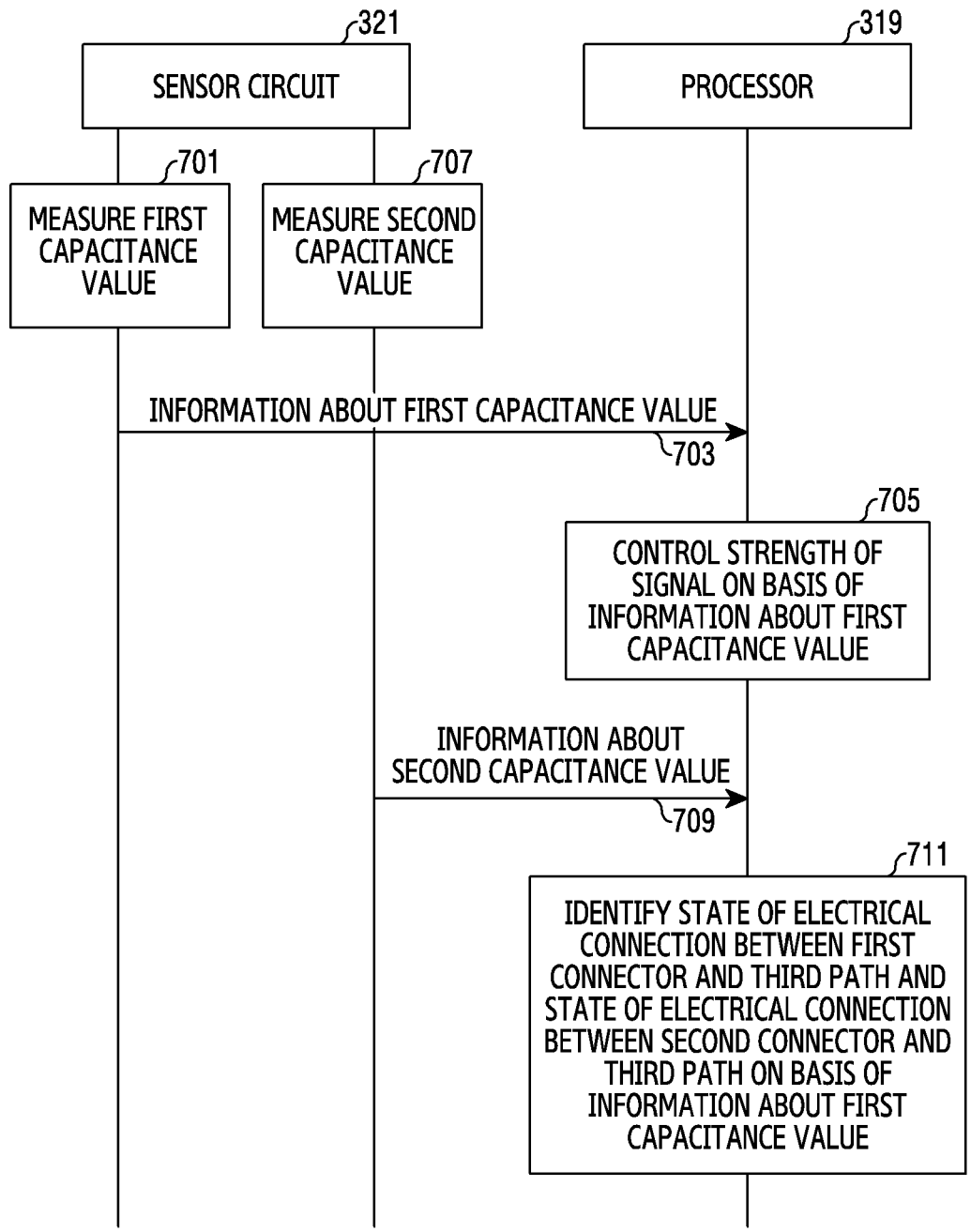
FIG. 7 illustrates an example of an operation of an electronic device according to certain embodiments.

FIG. 7 illustrates an example of an operation of an electronic device according to certain embodiments. This operation may be performed by the electronic device 101 illustrated in FIG. 1, FIG. 2, FIG. 3, FIG. 4, FIG. 5A, FIG. 5B, or FIG. 6.

Referring to FIG. 7, in operation 701, a sensor circuit 321 may measure a first capacitance value. For example, the sensor circuit 321 may measure a first capacitance value at a first node 322 using a first path 325 connecting the first node 322 between an antenna 301 and a first connector 309 with the sensor circuit 321. For example, the first capacitance value may indicate an equivalent capacitance value of the circuit as seen from the first node 322 to the antenna 301. The first capacitance value may be changed by approach of an external object (e.g., a user's body part) into a certain proximity to the antenna 301. The first capacitance value may also be changed by the impedance of a matching circuit 305.

In operation 703, the sensor circuit 321 may provide information about (e.g., related to, associated with and/or including) the first capacitance value to the processor 319. For example, the sensor circuit 321 may periodically obtain the first capacitance value at regular intervals, and may periodically provide the first capacitance value to the processor 319 at regular intervals upon obtaining the first capacitance value. In another example, the sensor circuit 321 may periodically obtain the first capacitance value, may restrict transmission of the information about the first capacitance value when identifying that the first capacitance value is out of a predetermined reference range, and may transmit the information about the first capacitance value when identifying that the first capacitance value is within the reference range. However, the embodiments are not limited thereto. In certain embodiments, the information about the first capacitance value may include data indicating the first capacitance value. In certain embodiments, the information about the first capacitance value may also include data indicating the difference value between the first capacitance value and a reference value. In certain embodiments, the information about the first capacitance value may also include data indicating the difference between a previous first capacitance value and a current first capacitance value.

However, the information about the first capacitance value is not limited thereto. The processor 319 may receive the information about the first capacitance value from the sensor circuit 321.

In operation 705, the processor 319 may control the strength of a signal output through the antenna 301 on the basis of the information about the first capacitance value. For example, when it is identified that the first capacitance value is within the reference range, the processor 319 may control the strength of the signal so that the signal has a specific absorption rate (SAR) lower than a reference SAR. In another example, when it is identified that the first capacitance value is out of the reference range, the processor 319 may control the strength of the signal independently of the reference SAR. However, the embodiments are not limited thereto.

In operation 707, the sensor circuit 321 may measure a second capacitance value. For example, the sensor circuit 321 may measure a second capacitance value at a second node 327 using a second path 331 that is different from the first path 325 and connects the second node 327 between the antenna 301 and the first connector 309 with the sensor circuit 321. For example, the second capacitance value may mean an equivalent capacitance value of the circuit seen from the second node 327 to the RFIC 317. The second capacitance value may be changed by the state of an electrical connection between the first connector 309 and an electrical path 311 or the state of an electrical connection between a second connector 313 and the electrical path 311.

In operation 709, the sensor circuit 321 may provide information about the second capacitance value to the processor 319. For example, the sensor circuit 321 may periodically obtain the second capacitance value at regular intervals and may periodically provide the second capacitance value to the processor 319 at regular intervals, upon obtaining the second capacitance value. In another example, the sensor circuit 321 may obtain the second capacitance value upon execution of a specified application (e.g., an application supporting a test mode) and may provide the second capacitance value to the processor 319 upon obtaining the second capacitance value. In still another example, the sensor circuit 321 may periodically obtain the second capacitance value, may restrict transmission of the information about the second capacitance value when identifying that the second capacitance value is within a first reference range, and may transmit the information about the second capacitance value when identifying that the second capacitance value is out of the first reference range. In yet another example, the sensor circuit 321 may obtain the second capacitance value upon execution of the specified application, may restrict transmission of the information about the second capacitance value when identifying that the second capacitance value is within the first reference range, and may transmit the information about the second capacitance value when identifying that the second capacitance value is out of the first reference range. However, the embodiments are not limited thereto. In certain embodiments, the information about the second capacitance value may include data indicating the second capacitance value. In certain embodiments, the information about the second capacitance value may also include data indicating the difference value between the second capacitance value and a reference value. In certain embodiments, the information about the second capacitance value may also include data indicating the difference between a previous second capacitance value and a current second capacitance value. However, the information about the second capacitance value is not limited thereto. The processor 319 may receive the information about the second capacitance value from the sensor circuit 321.

In operation 711, the processor 319 may identify the state of the connection between the electrical path 311 (e.g., a third path) and the first connector 309, and the state of the connection between the electrical path 311 and the second connector 313, on the basis of the information about the second capacitance value. For example, when it is identified that the second capacitance value is within the first reference range, the processor 319 may identify that the electrical path 311 and the first connector 309 are electrically connected and the electrical path 311 and the second connector 313 are electrically connected. In another example, when it is identified that the second capacitance value is out of the first reference range and is within a second reference range, the processor 319 may identify that the electrical path 311 and the first connector 309 are electrically connected and the electrical path 311 and the second connector 313 are electrically disconnected. In still another example, when it is identified that the second capacitance value is out of the first reference range and is out of the second reference range, the processor 319 may identify that the electrical path 311 and the first connector 309 are electrically disconnected. However, the embodiments are not limited thereto.

In FIG. 7, it should be noted that operations 707, 709, and 711 may be performed independently of operations 701, 703, and 705. For example, operations 707, 709, and 711 may be performed while performing operations 701, 703, and 705 or may be performed before or after performing operations 701, 703, and 705. However, the embodiments are not limited thereto.

As described above, the electronic device 101 according to certain embodiments may identify the state of the connection between the first connector 309 and the electrical path 311 (hereinafter, also referred to as a third path) and the state of the connection between the second connector 313 and the electrical path 311 using the sensor circuit 312 configured to measure a capacitance value such that the strength of a signal output through the antenna 301 meets a defined standard for an SAR. 321. The electronic device 101 according to certain embodiments may enhance resource efficiency of the electronic device 101 by performing the identification.

Figure 8:
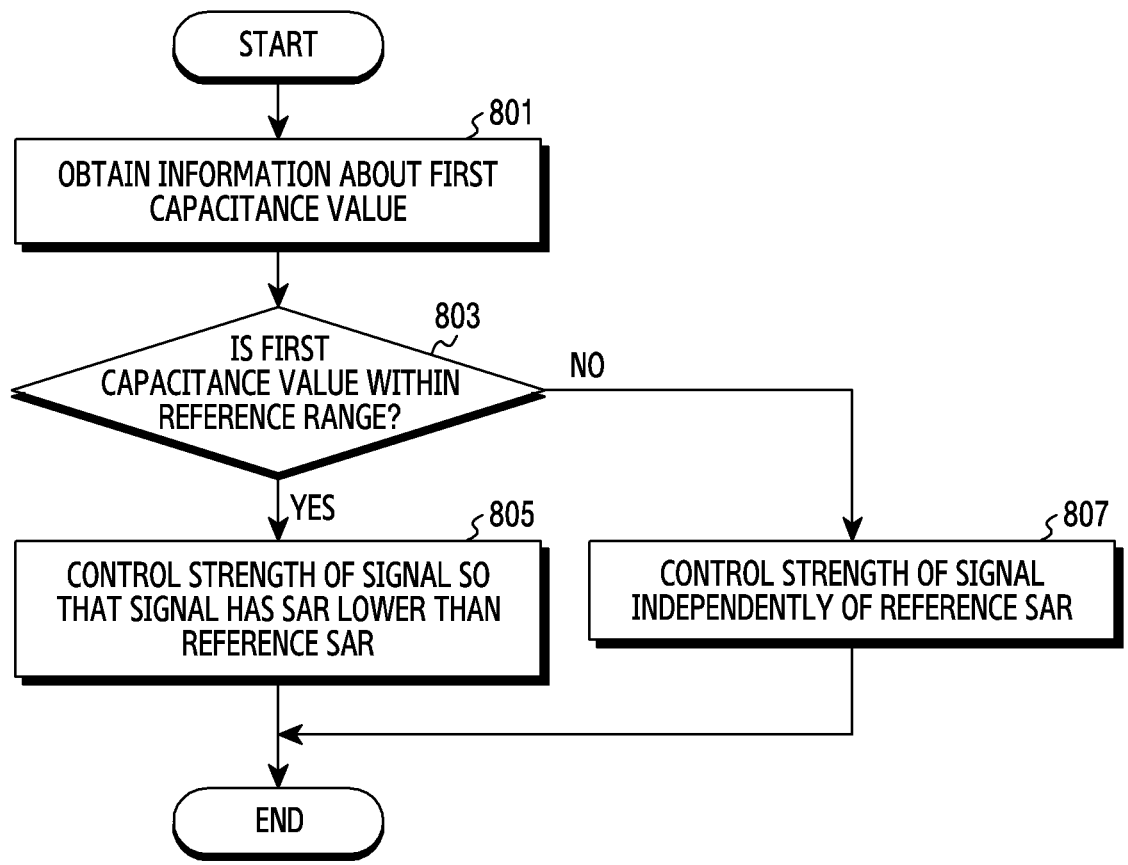
FIG. 8 illustrates an example of an operation of an electronic device that controls the strength of a signal output through an antenna on the basis of information about a first capacitance value according to certain embodiments.

FIG. 8 illustrates an example of an operation of an electronic device that controls the strength of a signal output through an antenna on the basis of information about a first capacitance value according to certain embodiments. This operation may be performed by the electronic device 101 illustrated in FIG. 1, FIG. 2, FIG. 3, FIG. 4, FIG. 5A, FIG. 5B, or FIG. 6 or the processor (e.g., the processor 120 or the processor 319) included in the electronic device 101.

Operations 801 to 807 of FIG. 8 may be related to operation 705 of FIG. 7.

In operation 801, the processor 319 may obtain information about a first capacitance value from a sensor circuit 321. The information about the first capacitance value may indicate the information about (e.g., including, associated with, relevant to, etc.) the first capacitance value defined in the description of FIG. 7.

In operation 803, the processor 319 may determine whether the first capacitance value is within a predetermined reference range in order to determine whether the electronic device 101 is in contact with a user's body part. For example, when it is determined that the first capacitance value is within the reference range, the processor 319 may determine that the electronic device 101 is in contact the user's body part or may determine that the electronic device 101 is positioned in proximity to the user's body part. In another example, when it is determined that the first capacitance value is out of the reference range, the processor 319 may determine that the electronic device 101 is not in contact with the user's body part or may determine that the electronic device 101 is spaced apart from the user's body part. When it is determined that the electronic device 101 is in contact the user's body part, the processor 319 may perform operation 805. When it is determined that the electronic device 101 is not in contact the user's body part, the processor 319 may perform operation 807.

In operation 805, when it is determined that the electronic device 101 is in contact the user's body part, the processor 319 may control the strength of a signal output through an antenna 301 so that the signal has an SAR lower than a predetermined reference SAR. For example, when it is determined that the electronic device 101 is in contact the user's body part, the processor 319 may control the strength of the signal output through the antenna 301 so that the signal has an SAR lower than the reference SAR.

In operation 807, when it is determined that the electronic device 101 is not in contact the user's body part, the processor 319 may control the strength of the signal output through the antenna 301 independently of the reference SAR. For example, the processor 319 may control the strength of the signal output through the antenna 301 on the basis of the quality of a channel between an external electronic device (e.g., a base station) and the electronic device 101, independently of the reference SAR. Accordingly, no reference to the predetermined reference SAR is utilized in controlling signal strength.

Figure 9:
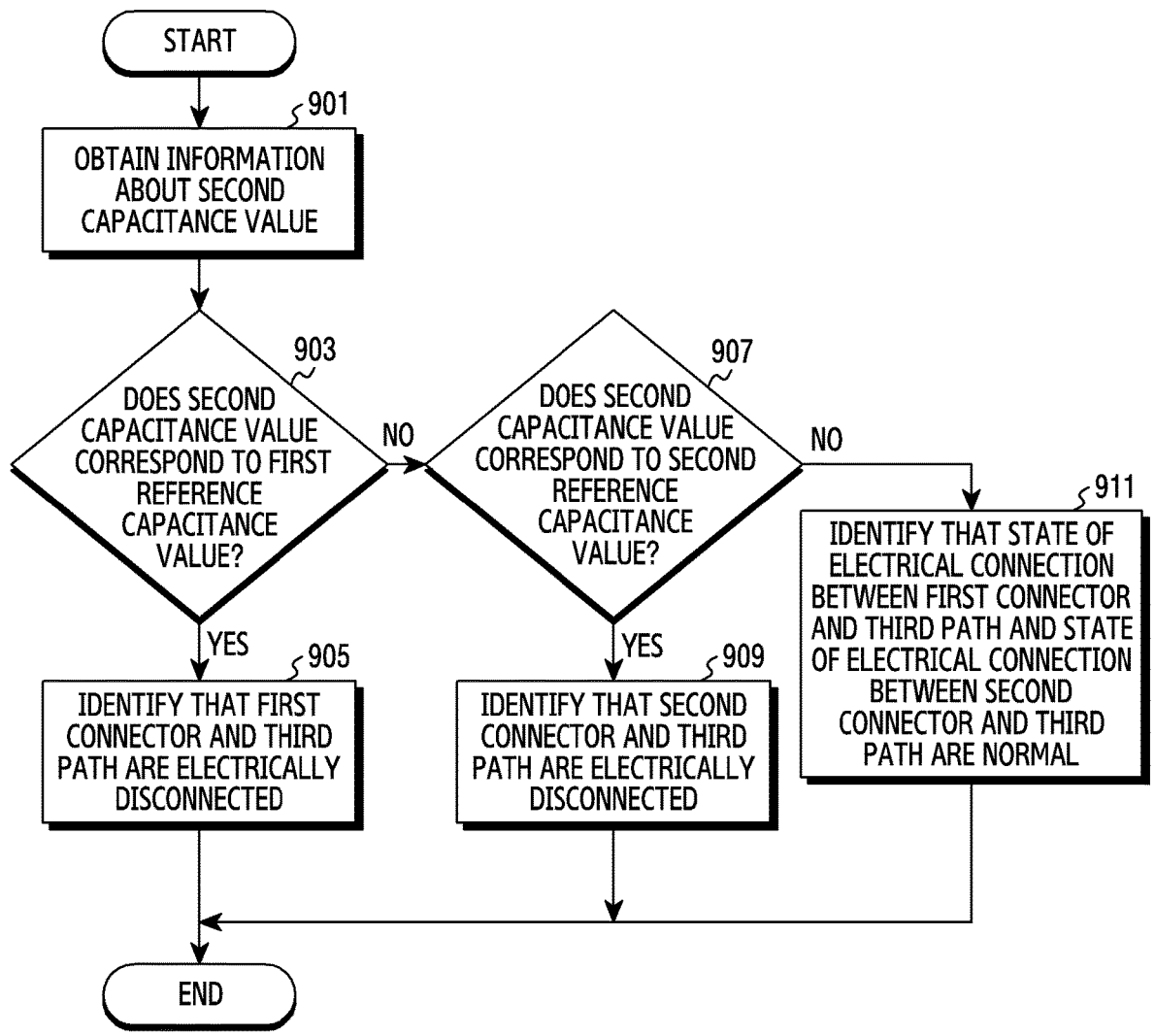
FIG. 9 illustrates an example of an operation of an electronic device that identifies the state of a connection between a first connector and a third path and the state of a connection between a second connector and the third path on the basis of information about a second capacitance value according to certain embodiments.

FIG. 9 illustrates an example of an operation of an electronic device that identifies the state of a connection between a first connector and a third path and the state of a connection between a second connector and the third path on the basis of information about a second capacitance value according to certain embodiments. This operation may be performed by the electronic device 101 illustrated in FIG. 1, FIG. 2, FIG. 3, FIG. 4, FIG. 5A, FIG. 5B, or FIG. 6 or the processor (e.g., the processor 120 or the processor 319) included in the electronic device 101.

Operations 901 to 911 of FIG. 9 may be related to operation 711 of FIG. 7.

In operation 901, the processor 319 may obtain information about a second capacitance value from a sensor circuit 321. The information about the second capacitance value may mean the information about the second capacitance value defined in the description of FIG. 7.

In operation 903, the processor 319 may determine whether the second capacitance value corresponds to a first reference capacitance value in order to identify the state of a connection between a third path (e.g., the electrical path 311) and a first connector 309. In certain embodiments, when the third path 311 and the first connector 309 are electrically disconnected, the second capacitance value measured at a second node 327 is the capacitance value of the first connector 309, and thus the first reference capacitance value may correspond to the capacitance value of the first connector 309. In certain embodiments, the second capacitance value corresponding to the first reference capacitance value may mean that the second capacitance value is equal to the first reference capacitance value. In certain embodiments, the second capacitance value corresponding to the first reference capacitance value may also mean that the difference between the second capacitance value and the first reference capacitance value is within a reference range. When it is determined that the second capacitance value corresponds to the first reference capacitance value, the processor 319 may perform operation 905. When it is determined that the second capacitance value does not correspond to the second reference capacitance value, the processor 319 may perform operation 907.

In operation 905, when it is determined that the second capacitance value corresponds to the first reference capacitance value, the processor 319 may identify that the first connector 309 and the third path 311 are electrically disconnected. For example, when it is determined that the second capacitance value corresponds to the first reference capacitance value, the processor 319 may identify that the state of the electrical connection between the first connector 309 and the third path 311 is abnormal.

In operation 907, when it is determined that the second capacitance value does not correspond to the first reference capacitance value, the processor 319 may determine whether the second capacitance value corresponds to a second reference capacitance value. In certain embodiments, when the third path 311 and the second connector 313 are electrically disconnected, the second capacitance value measured at the second node 327 is determined on the basis of the capacitance value of the first connector 309 and the capacitance value of the third path 311, and thus the second reference capacitance value may be determined on the basis of the capacitance value of the first connector 309 and the capacitance value of the third path 311. In certain embodiments, the second capacitance value corresponding to the second reference capacitance value may mean that the second capacitance value is equal to the second reference capacitance value. In certain embodiments, the second capacitance value corresponding to the second reference capacitance value may also mean that the difference between the second capacitance value and the second reference capacitance value is within a reference range. When it is determined that the second capacitance value corresponds to the second reference capacitance value, the processor 319 may perform operation 909. When it is determined that the second capacitance value does not correspond to the second reference capacitance value, the processor 319 may perform operation 911.

In operation 909, when it is determined that the second capacitance value corresponds to the second reference capacitance value, the processor 319 may identify that a second connector 313 and the third path 311 are electrically disconnected. For example, when it is determined that the second capacitance value corresponds to the second reference capacitance value, the processor 319 may identify that the state of an electrical connection between the second connector 313 and the third path 311 is abnormal.

In operation 911, when it is determined that the second capacitance value does not correspond to the second reference capacitance value, the processor 319 may identify that the state of the electrical connection between the first connector 309 and the third path 311 and the state of the electrical connection between the second connector 313 and the third path 311 are normal. For example, since the second capacitance value not corresponding to the first reference capacitance value and the second reference capacitance value may mean that the third path 311 and the first connector 309 are electrically connected and the third path 311 and the second connector 313 are electrically connected, the processor 319 may identify that the state of the electrical connection between the first connector 309 and the third path 311 and the state of the electrical connection between the second connector 313 and the third path 311 are normal.

Figure 10:
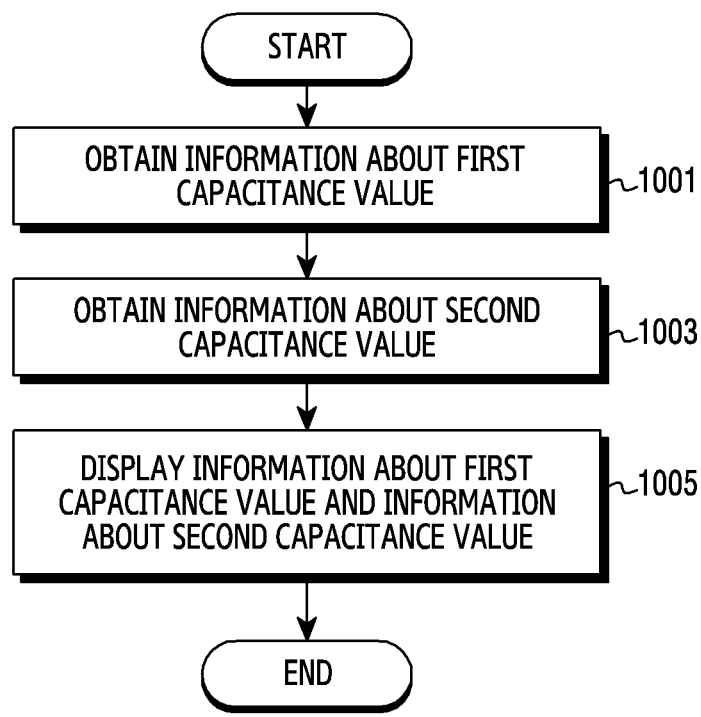
FIG. 10 illustrates another example of an operation of an electronic device according to certain embodiments.

FIG. 10 illustrates another example of an operation of an electronic device according to certain embodiments. This operation may be performed by the electronic device 101 illustrated in FIG. 1, FIG. 2, FIG. 3, FIG. 4, FIG. 5A, FIG. 5B, or FIG. 6.

Referring to FIG. 10, in operation 1001, a processor 319 may obtain information about a first capacitance value. For example, the first capacitance value may mean a capacitance value measured at a first node 322. In certain embodiments, when an application for supporting a test mode is executed in the electronic device 101, the processor 319 may request the first capacitance value from a sensor circuit 321 and may obtain the information about the first capacitance value provided from the sensor circuit 321 in response to the request.

In operation 1003, the processor 319 may obtain information about a second capacitance value. For example, the second capacitance value may mean a capacitance value measured at a second node 327. In certain embodiments, when the application for supporting the test mode is executed in the electronic device 101, the processor 319 may request the second capacitance value from the sensor circuit 321 and may obtain the information about the second capacitance value provided from the sensor circuit 321 in response to the request.

In operation 1005, the processor 319 may display the information about the first capacitance value and the information about the second capacitance value on a display device 160 of the electronic device 101. For example, the information about the first capacitance value and the information about the second capacitance value may be displayed in a user interface of the application for supporting the test mode. In certain embodiments, while obtaining the information about the first capacitance value and the information about the second capacitance value from the sensor circuit 321, the processor 319 may display the obtained information about the first capacitance value and the obtained information about the second capacitance value on the display device 160 of the electronic device 101. For example, when a user's body part is in contact with at least part of a housing of the electronic device 101 or when the user's body part in contact with at least part of the housing of the electronic device 101 is spaced apart, the information about the first capacitance value displayed on the display device 160 may be changed. In another example, when a first connector 309 and a third path (e.g., the electrical path 311) are electrically disconnected or a second connector 313 and the third path are electrically disconnected, the information about the second capacitance value displayed on the display device 160 may be changed.

Figure 11:
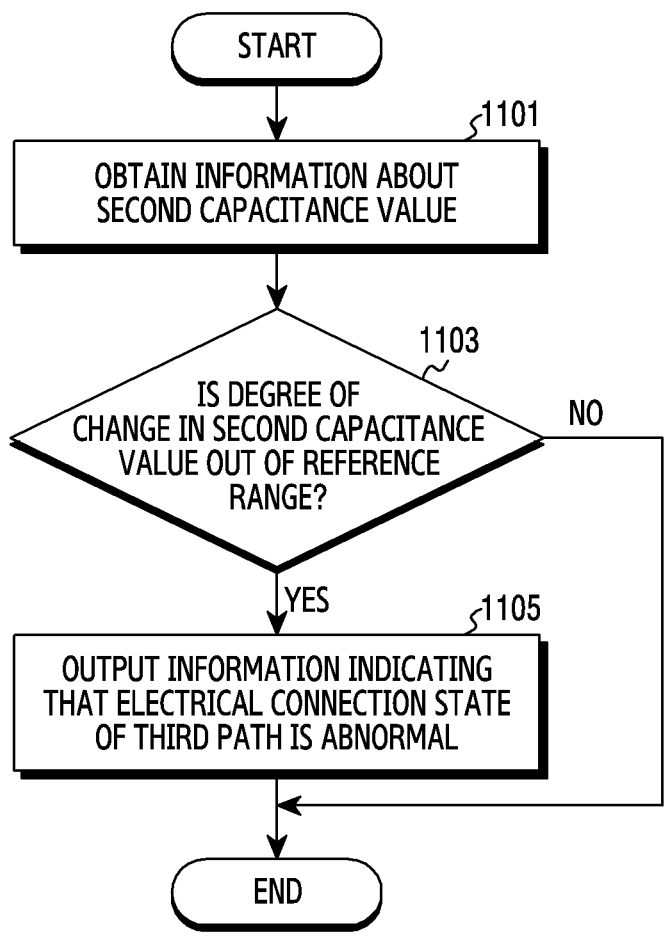
FIG. 11 illustrates an example of an operation of an electronic device that outputs information about an electrical connection state of a third path according to certain embodiments.

FIG. 11 illustrates an example of an operation of an electronic device that outputs information about an electrical connection state of a third path according to certain embodiments. This operation may be performed by the electronic device 101 illustrated in FIG. 1, FIG. 2, FIG. 3, FIG. 4, FIG. 5A, FIG. 5B, or FIG. 6 or the processor (e.g., the processor 120 or the processor 319) included in the electronic device 101.

Referring to FIG. 11, in operation 1101, the processor 319 may obtain information about a second capacitance value from a sensor circuit 321. For example, operation 1101 may correspond to operation 709, operation 901, or operation 1003.

In operation 1103, the processor 319 may identify whether the degree of change in the second capacitance value is out of a reference range. In certain embodiments, the reference range may be configured in the electronic device 101 in order to identify whether a change between the second capacitance value obtained in operation 1101 and a second capacitance value measured while the state of an electrical connection between a third path (e.g., the electrical path 311) and a first connector 309 and the state of an electrical connection between the third path 311 and a second connector 313 are normal indicates that the third path (e.g., the electrical path 311) and the first connector 3099 are electrically disconnected or that the third path and the second connector 313 are electrically disconnected. When it is identified that the degree of change in the second capacitance value is within the reference range, the processor 319 may bypass operation 1105. When it is identified that the degree of change in the second capacitance value is out of the reference range, the processor 319 may perform operation 1105.

In operation 1105, when it is identified that the degree of change in the second capacitance value is out of the reference range, the processor 319 may output information indicating that an electrical connection state of the third path is abnormal. For example, the information may be displayed on a display device 160. In another example, the information may be output as an audio signal through a sound output device 155. In still another example, the information may be output as vibrations through the haptic module 179. However, the embodiments are not limited thereto.

As described above, an electronic device (e.g., the electronic device 101) according to certain embodiments may include: a housing; a first PCB (e.g., the first PCB 340) configured to be disposed in the housing and to include a first connector (e.g., the first connector 309) and a grip sensor (e.g., the sensor circuit 321); a second PCB (e.g., the second PCB 345) configured to be separated from the first PCB and to include a second connector (e.g., the second connector 313); an electrical path (e.g., the electrical path 311) configured to be electrically connected to the first connector and the second connector; at least one antenna (e.g., the antenna 301) configured to form part of the housing or to be disposed in the housing; a processor (e.g., the processor 319) configured to be operatively connected to the grip sensor and the one antenna; a first conductive path (e.g., the first path 325) configured to be electrically connected to the grip sensor and the one antenna; and a second conductive path (e.g., the second path 331) configured to be electrically connected to the grip sensor and the first connector.

According to certain embodiments, the electronic device may further include: a matching circuit (e.g., the matching circuit 305) configured to include a first terminal configured to be electrically connected to the antenna and a second terminal configured to be electrically connected to the first connector; and a ground member, such that the matching circuit may include at least one of a resistor, a capacitor, or an inductor and a third conductive path configured to be electrically connected to the ground member. According to certain embodiments, the second conductive path may be electrically connected to the second terminal.

According to certain embodiments, the electrical path may include at least one of a coaxial cable or a flexible printed circuit board (FPCB).

According to certain embodiments, the grip sensor may be configured to measure a capacitance value of the first connector through the second conductive path and to provide information about the capacitance value to the processor, and the processor may be configured to identify a state of an electrical connection between the first connector and the electrical path and a state of an electrical connection between the second connector and the electrical path on the basis of the capacitance value. According to certain embodiments, the processor may be configured to identify that the first connector and the electrical path are electrically disconnected upon identifying that the capacitance value corresponds to a capacitance value of the first connector. According to certain embodiments, the processor may be configured to identify that the second connector and the electrical path are electrically disconnected upon identifying that the capacitance value corresponds to the capacitance value of the first connector and a capacitance value of the electrical path.

According to certain embodiments, the electronic device may further include: a capacitor (e.g., the capacitor 505) configured to be electrically connected to the second connector in order to identify a state of an electrical connection between the first connector and the electrical path and a state of an electrical connection between the second connector and the electrical path.

As described above, an electronic device (e.g., the electronic device 101) according to certain embodiments may include: a sensor circuit (e.g., the sensor circuit 321) configured to measure a capacitance value; a memory (e.g., the memory 130) configured to store instructions; an antenna (e.g., the antenna 301); radio-frequency integrated circuitry (RFIC, e.g., the RFIC 317); a first connector (e.g., the first connector 309) configured to be electrically coupled with the antenna; a second connector (e.g., the second connector 313) configured to be electrically coupled with the RFIC; a first path (e.g., the first path 325) configured to electrically connect a first node between the antenna and the first connector with the sensor circuit; a second path (e.g., the second path 331) configured to electrically connect a second node between the antenna and the first connector with the sensor circuit and to be distinguished from the first path; a third path (e.g., the electrical path 311) configured to be electrically connected to the first connector and the second connector; and a processor (e.g., the processor) configured to be operatively connected to the sensor circuit, such that the sensor circuit may be configured to: measure a first capacitance value at the first node using the first path; measure a second capacitance value at the second node using the second path; and provide information about the first capacitance value and information about the second capacitance value to the processor, and the processor may be configured to, when the instructions are executed; control a strength of a signal output through the antenna on the basis of the information about the first capacitance value; and identify a state of an electrical connection between the first connector and the third path and a state of an electrical connection between the second connector and the third path on the basis of the information about the second capacitance value.

According to certain embodiments, the electronic device may further include: a matching circuit configured to include a first terminal configured to be connected to the antenna through the first node and a second terminal configured to be connected to the first connector through the second node.

According to certain embodiments, the processor may be configured to, when the instructions are executed, control the strength of the signal such that the signal has a specific absorption rate (SAR) lower than a reference SAR on the basis of the information about the first capacitance value.

According to certain embodiments, the information about the second capacitance value may include data about a change in the second capacitance value, and the sensor circuit may be configured to provide the information about the second capacitance value including the data about the change in the second capacitance value to the processor upon detecting that the second capacitance value is changed from a first value to a second value.

According to certain embodiments, the sensor circuit may include a grip sensor.

According to certain embodiments, the electronic device may further include: a display; and a touch sensor configured to be operatively coupled with the display, such that the sensor circuit may include the touch sensor.

According to certain embodiments, the processor may be configured to, when the instructions are executed, identify that the first connector and the third path are electrically disconnected upon identifying that the second capacitance value corresponds to a first reference capacitance value. According to certain embodiments, the processor may be configured to identify that the second connector and the third path are electrically disconnected upon identifying that the second capacitance value corresponds to a second reference capacitance value higher than the first reference capacitance value.

According to certain embodiments, the electronic device may further include: a capacitor configured to be electrically connected to the second connector in order to identify the state of the electrical connection between the first connector and the third path and the state of the electrical connection between the second connector and the third path.

As described above, an electronic device (e.g., the electronic device 101) according to certain embodiments may include: a sensor circuit (e.g., the sensor circuit 321) configured to obtain information about a capacitance value; a first circuit (e.g., the antenna 301) configured to be electrically connected to the sensor circuit through a first path and to operate differently depending on whether contact between an external object and the electronic device is detected; a first connector (e.g., the first connector 309) configured to be electrically connected to the sensor circuit through a second path distinguished from the first path; a second connector (e.g., the second connector 313); a coaxial cable (e.g., the electrical path 311) configured to be electrically connected to the first connector and the second connector; a display (e.g., the display device 160); a memory (e.g., the memory 130) configured to store instructions; and a processor (e.g., the processor 319), such that the processor may be configured to, when the instructions are executed: obtain information about a first capacitance value measured through the first path from the first circuit using the sensor circuit; obtain information about a second capacitance value measured through the second path from the first connector using the sensor circuit; and display the information about the first capacitance value and the information about the second capacitance value on the display.

According to certain embodiments, the information about the first capacitance value may be used to identify whether the contact between the external object and the electronic device is detected, and the information about the second capacitance value may be used to identify a state of an electrical connection between the first connector and the coaxial cable and a state of an electrical connection between the second connector and the coaxial cable. According to certain embodiments, the processor may be further configured, when the instructions are executed, to output information indicating that the state of the electrical connection between the first connector and the coaxial cable or the state of the electrical connection between the second connector and the coaxial cable is abnormal upon identifying that a degree of a change in the second capacitance value is out of a reference range.

Methods according to embodiments described in the claims or specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to certain embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and certain embodiments of the disclosure are not limited to a single element or multiple elements thereof. Further, either multiple elements expressed in the description may be configured into a single element or a single element in the description may be configured into multiple elements.

While the disclosure has been shown and described with reference to certain embodiments thereof, it will be understood by those skilled in the art that various changes in form and details may be made therein without departing from the disclosure. Therefore, the disclosure should not be defined as being limited to the embodiments, but should be defined by the appended claims and equivalents thereof.

What is claimed is:

1. An electronic device, comprising:
   a housing;
   a first printed circuit board (PCB) disposed in the housing and including a first connector and a grip sensor;
   a second PCB disposed separate from the first PCB and including a second connector;
   an electrical path electrically coupled to the first connector and the second connector;
   at least one antenna forming part of the housing or disposed within the housing;
   a processor operatively connected to the grip sensor and the at least one antenna;
   a first conductive path electrically coupled to the grip sensor and the at least one antenna; and
   a second conductive path electrically coupled to the grip sensor and the first connector,
   wherein the grip sensor is configured to measure a first capacitance value of the second conductive path and provide the first capacitance value to the processor, and
   wherein the processor is configured to: identify a state of a first electrical connection between the first connector and the electrical path, and a state of a second electrical connection between the second connector and the electrical path, based on the first capacitance value.

2. The electronic device of claim 1, further comprising:
   a matching circuit including a first terminal electrically coupled to the at least one antenna and a second terminal electrically coupled to the first connector; and
   a ground member,
   wherein the matching circuit includes at least one of a resistor, a capacitor, an inductor, and a third conductive path electrically coupled to the ground member.

3. The electronic device of claim 2, wherein the second conductive path is electrically coupled to the second terminal.

4. The electronic device of claim 1, wherein the electrical path comprises at least one of a coaxial cable or a flexible printed circuit board (FPCB).

5. The electronic device of claim 1, wherein the processor is configured to: detect a disconnection between the first connector and the electrical path based on detecting that the first capacitance value corresponds to a second capacitance value of the first connector.

6. The electronic device of claim 5, wherein the processor is configured to: detect a disconnection between the second connector and the electrical path based on detecting that the first capacitance value corresponds to the second capacitance value of the first connector and a third capacitance value of the electrical path.

7. The electronic device of claim 1, further comprising:
   a capacitor, electrically connected to the second connector, to identify a state of a first electrical connection between the first connector and the electrical path, and a state of a second electrical connection between the second connector and the electrical path.

8. An electronic device, comprising:
   a sensor circuit configured to measure a capacitance value;
   a memory configured to store instructions;
   an antenna;
   radio-frequency integrated circuitry (RFIC);
   a first connector electrically coupled with the antenna;
   a second connector electrically coupled with the RFIC;
   a first path electrically coupling a first node between the antenna and the first connector with the sensor circuit;
   a second path electrically coupling a second node between the antenna and the first connector with the sensor circuit and distinguished from the first path;
   a third path electrically coupling the first connector and the second connector; and
   a processor operatively connected to the sensor circuit,
   wherein the sensor circuit is configured to:
      measure a first capacitance value at the first node using the first path;
      measure a second capacitance value at the second node using the second path; and
      transmit information about the first capacitance value and information about the second capacitance value to the processor, and
   wherein the instructions are executable by the processor to cause the electronic device to:

receive the information associated with the first capacitance value and the second capacitance value;

control a strength of a signal output through the antenna based on information about the first capacitance value; and identify a state of an electrical connection between the first connector and the third path, and a state of an electrical connection between the second connector and the third path, information about the second capacitance value.

9. The electronic device of claim 8, further comprising:
a matching circuit including a first terminal coupled to the antenna through the first node, and a second terminal connected to the first connector through the second node.

10. The electronic device of claim 8, wherein the instructions are further executable by the processor to cause the electronic device to:
set the strength of the signal such that the signal has a specific absorption rate (SAR) lower than a reference SAR, based on the information about the first capacitance value.

11. The electronic device of claim 8, wherein the information about the second capacitance value includes data indicating a change in the second capacitance value, and
wherein the information about the second capacitance value including the data indicating the change in the second capacitance value is transmit to the processor based on detecting that the second capacitance value changes from a first value to a second value.

12. The electronic device of claim 8, wherein the sensor circuit includes a grip sensor.

13. The electronic device of claim 8, further comprising:
a display, wherein the sensor circuit comprises a touch sensor operatively coupled with the display.

14. The electronic device of claim 8, wherein the instructions are further executable by the processor to cause the electronic device to: determine that the first connector and the third path are electrically disconnected based on detecting that the second capacitance value corresponds to a first reference capacitance value.

15. The electronic device of claim 14, wherein the instructions are further executable by the processor to cause the electronic device to: determine that the second connector and the third path are electrically disconnected based on detecting that the second capacitance value is greater than the first reference capacitance value.

16. The electronic device of claim 8, further comprising:
a capacitor electrically couple to the second connector, and configured to identify the state of the electrical connection between the first connector and the third path, and the state of the electrical connection between the second connector and the third path.

17. An electronic device, comprising:
a sensor circuit configured to obtain information including a capacitance value;
a first circuit electrically coupled to the sensor circuit through a first path, and configured to operate differently depending on whether contact between the electronic device and an external object is detected;
a first connector electrically coupled to the sensor circuit through a second path;
a second connector;
a coaxial cable electrically coupled to the first connector and the second connector;
a display;
a memory configured to store instructions; and
a processor,
wherein the instructions are executable by the processor to cause the electronic device to:
obtain information about a first capacitance value measured through the first path from the first circuit as detected by the sensor circuit;
obtain information about a second capacitance value measured through the second path from the first connector as detected by the sensor circuit, wherein the second path is different from the first path; and
display the information about the first capacitance value and the information about the second capacitance value on the display.

18. The electronic device of claim 17, wherein the contact between the external object is detected based at least in part on the information about the first capacitance value, and
wherein a state of an electrical connection between the first connector and the coaxial cable, and a state of an electrical connection between the second connector and the coaxial cable are identified based at least in part on the information about the second capacitance value.

19. The electronic device of claim 18, wherein the instructions are executable by the processor to cause the electronic device to:
output on the display information indicating an abnormal state of the electrical connection between the first connector and the coaxial cable, or of the electrical connection between the second connector and the coaxial cable, based on detecting that a degree of a change in the second capacitance value is disposed outside of a predetermined reference range.

* * * * *